United States Patent [19]
Roberts et al.

[11] Patent Number: 5,734,661
[45] Date of Patent: Mar. 31, 1998

[54] METHOD AND APPARATUS FOR PROVIDING EXTERNAL ACCESS TO INTERNAL INTEGRATED CIRCUIT TEST CIRCUITS

[75] Inventors: Gordon Roberts, Meridian; James E. Miller, Jr., Boise, both of Id.

[73] Assignee: Micron Technology, Inc., Boise, Id.

[21] Appl. No.: 717,133

[22] Filed: Sep. 20, 1996

[51] Int. Cl.⁶ .................................................. G06F 11/00
[52] U.S. Cl. .................................................. 371/22.5
[58] Field of Search ........................ 371/22.5, 22.1, 371/22.2, 22.6; 365/230.03, 200

[56] References Cited

U.S. PATENT DOCUMENTS

5,535,331  7/1996  Swobodz et al. .................. 395/183.21
5,638,334  6/1997  Farmwald et al. ..................... 365/230

*Primary Examiner*—Vincent P. Canney
*Attorney, Agent, or Firm*—Seed and Berry LLP

[57] ABSTRACT

An integrated circuit includes an integrated circuit die mounted in a package having a plurality of externally accessible contacts. A functional circuit, such as a memory circuit, is formed on the integrated circuit die and is coupled through bonding pads to the external contacts of the integrated circuit. A test circuit is also formed on the integrated circuit die to allow performance parameters to be determined by performing tests on the test circuit when the test circuit is in wafer form before packaging. To allow tests to be performed on the test circuit after packaging, a switch circuit formed on the integrated circuit die selectively couples input/output terminals of the test circuit to respective bonding pads that are connected to the externally accessible contacts. The switch circuit is operated by a switch controller, which may be a decoder that responds to a pattern of signals or a sequence of signals applied to the externally accessible contacts or an overvoltage detector that responds to a voltage outside a range of operating voltages for the functional circuit.

39 Claims, 7 Drawing Sheets

METHOD AND APPARATUS FOR PROVIDING EXTERNAL ACCESS TO INTERNAL INTEGRATED CIRCUIT TEST CIRCUITS

TECHNICAL FIELD

The present invention relates to testing integrated circuits, and more specifically, to a method and apparatus for obtaining access to internal test circuits in integrated circuits after the integrated circuits have been packaged.

BACKGROUND OF THE INVENTION

Figure 1:
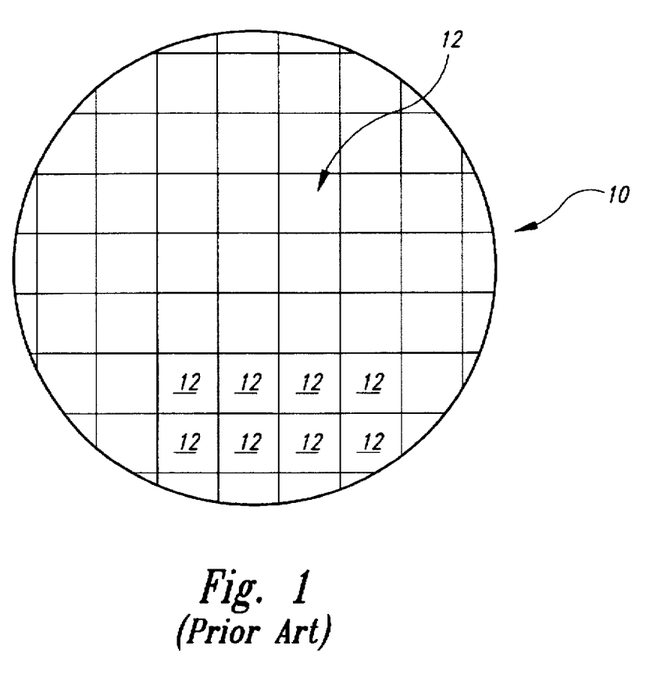
FIG. 1 is a schematic plan view of a conventional semiconductor wafer showing a plurality of integrated circuits fabricated on its surface.

A large number of integrated circuits are simultaneously fabricated on semiconductor wafers, such as the semiconductor wafer 10 shown in FIG. 1. In a typical wafer having a diameter of 6 or 8 inches, hundreds of integrated circuits 12 may be formed. After the integrated circuits 12 are fabricated and tested, the wafer 10 is diced with a saw to separate the integrated circuits 12 from each other. The individual integrated circuits 12 are then in a form known as a "die" 14.

Figure 2:
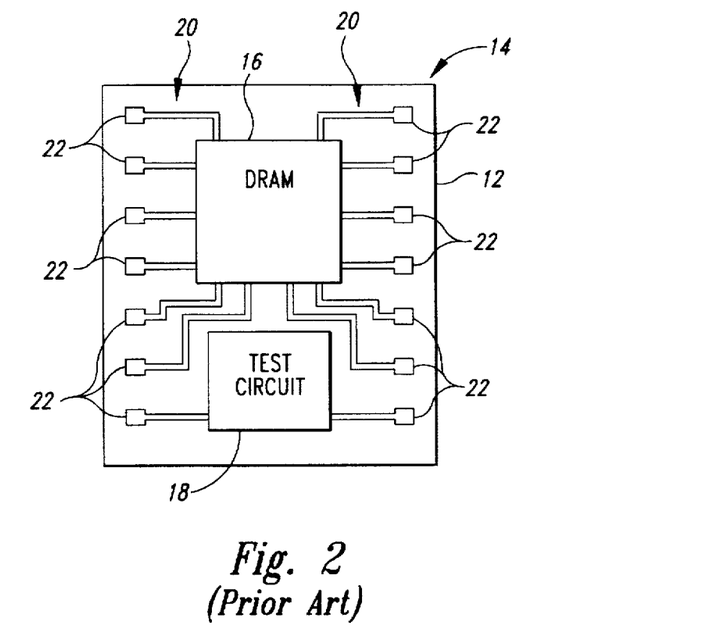
FIG. 2 is a detailed plan view showing one of the integrated circuits of FIG. 1 in greater detail after the wafer has been separated into a plurality of semiconductor dies.

With reference to FIG. 2, the integrated circuit die 14 has a functional circuit, such as a dynamic random access memory ("DRAM") 16, and it may have a test circuit 18. The test circuit 18 is fabricated on the integrated circuit die 14 solely to provide a means of determining the operating parameters, such as operating speed, of transistors and other semiconductor devices. The test circuit is not used to perform any function in the operation of the functional circuit, such as the DRAM 16.

The DRAM 16 and the test circuit 18 are connected through a plurality of conductors 20 to respective bonding pads 22. The conductors 20 and bonding pads 22 are formed on the semiconductor wafer 10 along with the DRAM 16 and the test circuit 18 by conventional means. For purposes of clarity and brevity, the die 14 is shown in FIG. 2 as having only fourteen bonding pads 22. However, it will be understood that conventional integrated circuit dies 14 generally have substantially larger numbers of bonding pads 22.

Figure 3:
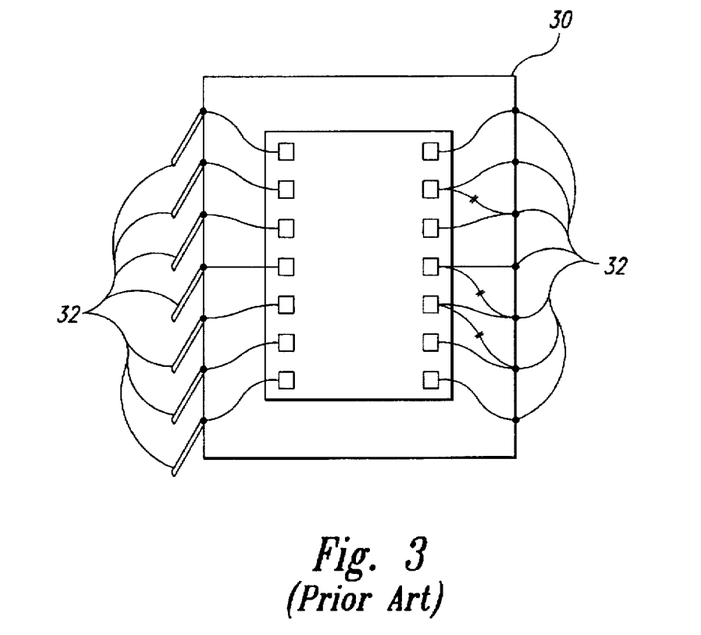
FIG. 3 is an isometric view showing the integrated circuit die of FIG. 2 during the packaging of the die.

The individual dies 14 shown in FIG. 2 are mounted in a package 30 as shown in FIG. 3. The package 30 has a number of externally accessible contacts 32 such as mounting pads or pins. The contacts 32 are coupled to respective bonding pads 22 formed on the semiconductor die 14. Although the integrated circuit package 30 is shown in FIG. 3 as having only twelve contacts 32, it will be understood that conventional integrated circuit packages 30 generally have substantially larger numbers of contacts. The integrated circuit die 14 is generally covered with a protective coating (not shown) and a cover (not shown) to complete the packaging process. After the completed integrated circuit package 30 is further tested, it is placed in a carrier or other container (not shown) for shipment and sale.

Manufactures of high quality integrated circuits require that integrated circuits be thoroughly tested at various times throughout the manufacturing process. For example, integrated circuits undergo a rigorous testing after fabrication while they are still in the form of a wafer 10 prior to separation into integrated circuit dies 14. As mentioned above, integrated circuits are tested again after they have been packaged. However, integrated circuits can be tested more thoroughly while they are in wafer form prior to packaging because it is at this time that all of the bonding pads 22 connected to the test circuit 18 are accessible. After the integrated circuit die 14 has been packaged, the bonding pads 22 connected to the test circuit 18 generally are not accessible. Thus, external access to internal test circuits 18 has not been possible after integrated circuit dies 14 have been packaged. Instead, external access after packaging has been limited to circuit nodes to which external access is required for the operation of the functional circuit, as well as a limited number of other circuit nodes of the functioning circuit (but not the test circuit) to which external access is not required for the operation of the functional circuit. For example, external access to fuses and anti-fuses used in the functioning circuit has been made available for the purpose of programming the fuses, and their programmed resistance can then be determined through external programming contacts.

With reference to FIG. 2, twelve of the bonding pads 22 are connected to the DRAM 16, and two of the bonding pads 22 are connected to the test circuit 18. As shown in FIG. 3, it is only the twelve bonding pads 22 that are connected to the DRAM 16 that are coupled to the externally accessible contacts 32. Significantly, neither of the bonding pads 22 that are connected to the test circuit 18 are coupled to the externally accessible contacts 32. Thus, the two bonding pads 22 connected to the test circuit 18 may not be accessed once the integrated circuit die 14 has been packaged.

Access to test circuits 18 and other test nodes normally inaccessible after packaging would be unnecessary if the operation of integrated circuits did not change after testing of the integrated circuits in wafer form. If testing of the normally inaccessible test nodes was satisfactory when the integrated circuit was tested in wafer form, then it would be satisfactory after it was packaged. However, processing of integrated circuits after wafer testing, including dicing and packaging, can affect the operation of integrated circuits. Thus, while a test node may test satisfactory in wafer form, it may test unsatisfactory after packaging. However, since the test node is not accessible after packaging, there is no way to determine if the operation of the test circuit 18 or other test node has changed. There is therefore a need to obtain post-packaging, external access to test circuits that are not normally accessible after packaging.

SUMMARY OF THE INVENTION

The inventive integrated circuit is fabricated on a semiconductor die mounted in a semiconductor package. The integrated circuit die includes a functional circuit (e.g., a dynamic random access memory) having a plurality of input/output terminals adapted to input or output electrical signals depending upon the function of the functional circuit, at least one test circuit having at least one input/output terminal adapted to input or output an electrical signal, and a plurality of pads formed on the semiconductor die coupled to the input/output terminals of the functional circuit. A first set of the pads is coupled to a plurality of externally accessible electrical contacts in the semiconductor package. A switch circuit selectively couples the input/output terminal of the test circuit to a pad in the first set responsive to a test initiate signal. The test initiate signal is selectively generated by a switch controller to cause the switch circuit to couple the input/output terminal of the test circuit to an externally accessible electrical contact.

Each test circuit preferably includes at least one input terminal adapted to receive an input signal, and at least one output terminal on which an output signal is generated in response to the input signal. The switch circuit then responds to the test initiate signal by selectively coupling the input terminal of each test circuit to a respective pad in the first set and the output terminal of each test circuit to a respective pad in the first set. The switch circuit may also selectively isolate the input/output terminals of the functional circuit from respective pads in the first set responsive to the test initiate signal. The switch circuit may be implemented by first and second sets of pass gates each having a control terminal. A respective pass gate in the first set is connected between each input/output terminal of the functional circuit and respective pads of the first set, and a respective pass gate in the second set is connected between each input/output terminal of each test circuit and respective pads of the first set. The pass gates are conductive responsive to their respective control terminals receiving a first logic level and non-conductive responsive to receiving a second logic level. An inverter having an input coupled to the switch controller receives the test initiate signal and generates an output having the second logic level responsive to receipt of a test initiate signal having the first logic level, and generates an output having the first logic level responsive to receipt of a test initiate signal having the second logic level. The input of the inverter is preferably coupled to the pass gates in either the first or second set and the output of the inverter is coupled to the pass gates in the other set. As a result, the pass gates in the first and second sets are alternately conductive.

The switch controller may comprises a detector having a plurality of inputs coupled to respective pads in a subset of the first set of pads. The detector preferably generates the test initiate signal responsive to detecting a predetermined pattern or sequence of signals applied to the pads in the subset of the first set. The switch controller may also comprise a supervoltage detector having an input coupled to a pad in the first set. The supervoltage detector preferably generates the test initiate signal responsive to detecting a voltage outside of a range of operating voltages for the functional circuit applied through the pad to the input of the supervoltage detector.

DETAILED DESCRIPTION OF THE INVENTION

Figure 4:
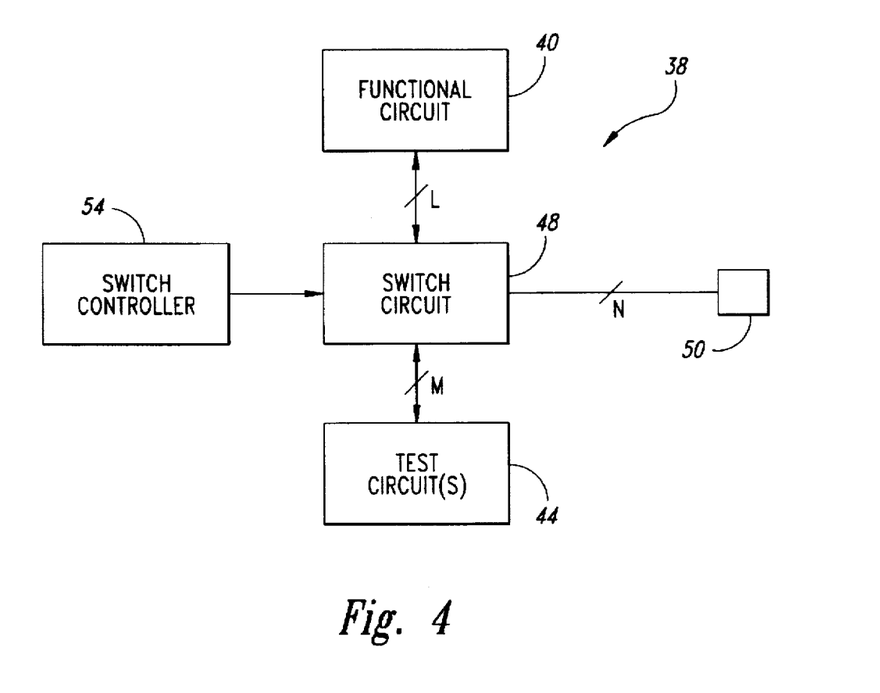
FIG. 4 is a block diagram of a preferred embodiment of the invention.

A preferred embodiment of the invention is illustrated in FIG. 4 in which an integrated circuit die 38 includes a functional circuit 40, which may be a DRAM, a static random access memory ("SRAM"), a microprocessor, etc. The integrated circuit die 38 also includes one or more test circuit 44, which may be field effect transistors, fuses or anti-fuses, bipolar transistors, or any other semiconductor devices for which testing after packaging would be desirable. The functional circuit 40 is connected through L lines to a switch circuit 48, and the test circuit(s) 44 is connected through M lines to the switch circuit 48. The switch circuit 48 is, in turn, connected through N lines to N respective bonding pads 50. The switch circuit 48 is controlled by a switch controller 54 to selectively connect the M lines of the test circuit(s) 44 to the N bonding pads 50. The switch circuit 48 may also selectively connect the L lines of the functional circuit 40 to the N bonding pads 50. Preferably, the N bonding pads 50 are alternately connected to either the L lines of the functional circuit 40 or the M lines of the test circuit(s) 44. However, it will be understood that the N bonding pads 50 may, in some cases, remain connected to the L lines of the functional circuit 40 while the switch circuit 48 also connects the N bonding pads 50 to the M lines of the test circuit(s) 44. Furthermore, the numbers L, M, and N may be equal to each other or all different from each other, as illustrated below. Thus, for example eight lines (M=8) from two test circuits 44 may be selectively connected to two bonding pads 50 (N=2) which may also be selectively connected to four lines (L=4) of the functional circuit 40. However, in practice, the lines of the functional circuit 40 will generally be connected to respective bonding pads 50 so that L=N.

Figure 5:
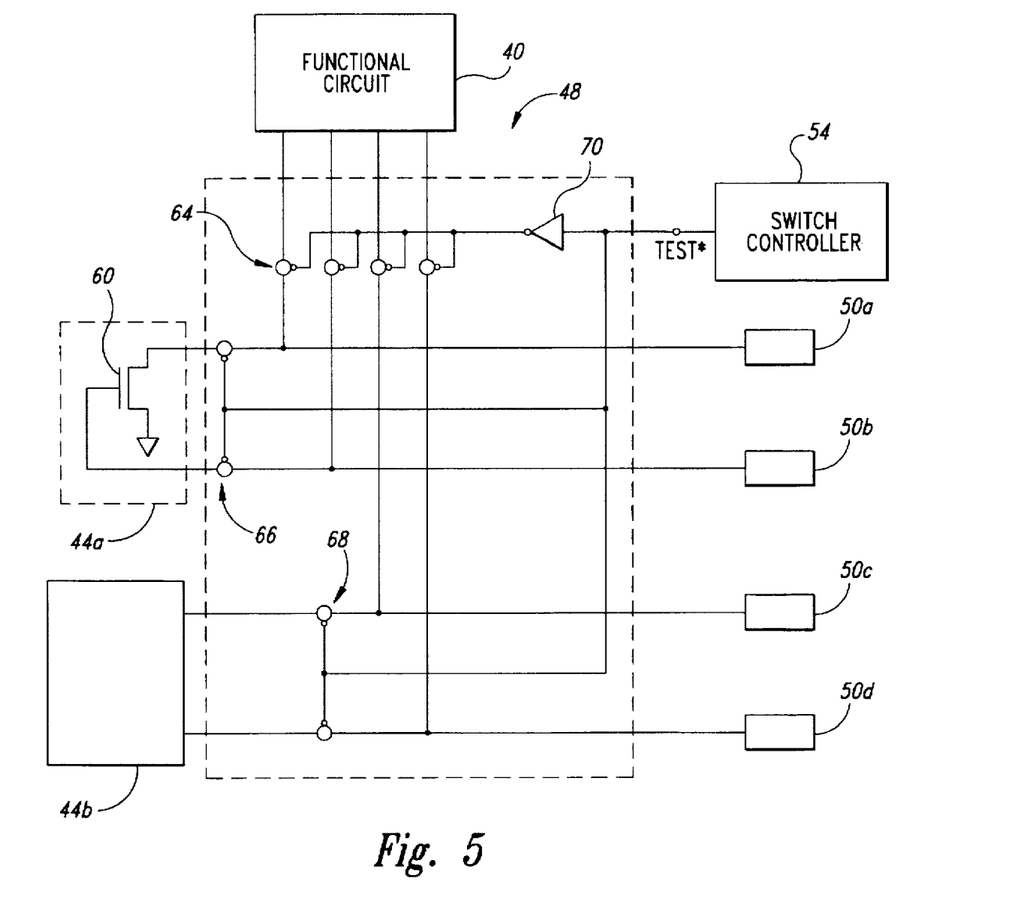
FIG. 5 is a logic and block diagram showing an exemplary embodiment of the switch circuit and test circuit of FIG. 4.

FIG. 5 shows one example of the switch circuit 48 of FIG. 4 in greater detail. The switch circuit 48 alternately connects four bonding pads 50a–d to either four respective lines of the functional circuit 40 or to four lines of two test circuits 44a,b. The test circuit 44a is shown in FIG. 5 as being a single NMOS transistor 60 having a grounded source and its drain and gate connected to respective mounting pads 50a,b. However, as mentioned above, the test circuits 44a,b can be any semiconductor device any for which testing after packaging would be desirable. Also, with appropriate modifications that will be apparent to one skilled in the art, the switch circuit 48 can connect more than two lines of a test circuit 44 to the bonding pads 50, and it can connect more than two test circuits 44 to the bonding pads 40. Similarly, the switch circuit 48 can connect greater or lesser numbers of lines of the functional circuit 40 to the bonding pads 50.

The switch circuit 48 includes a first set of conventional pass gates 64 selectively connecting the lines of the functional circuit 40 to the bonding pads 50. Similarly, second and third sets of pass gates 66, 68 selectively connect the two lines of each test circuit 44a,b, respectively, to the bonding pads 50a,b and c,d, respectively. The second and third set of pass gates 66, 68 are closed by an active low TEST* signal to connect the test circuits 44a,b to the bonding pads 50a,b and c,d, respectively. When the integrated circuit is not in a test mode, the TEST* signal is high. This high TEST* signal is then inverted by an inverter 70 to output a logic low signal to connect the lines of the functional circuit 40 to the bonding pads 50. The TEST* signal is generated by the switch controller 54, as explained in greater detail below.

Thus, the switch circuit 48 alternately connects the bonding pads 50 to either the functional circuit 40 or the test circuits 44. However, in appropriate circumstances, the lines of the functional circuit 40 may remain permanently connected to the bonding pads 50 thereby allowing the first set of pass gates 64 and the inverter 70 to be omitted. For example, the lines of the functional circuit 40 may remain permanently connected to the bonding pads 50 if the functional circuit 40 does not interfere with or affect the operation of the test circuits 44. Although the switch circuit 48 of FIG. 5 uses pass gates 64-68 to selectively couple the functional circuit 40 and the test circuits 44 to the bonding pads 50, other switching circuit, both presently known and unknown, may also be used. For example, a conventional multiplexer (not shown) having two sets of four inputs may be used.

Figure 6:
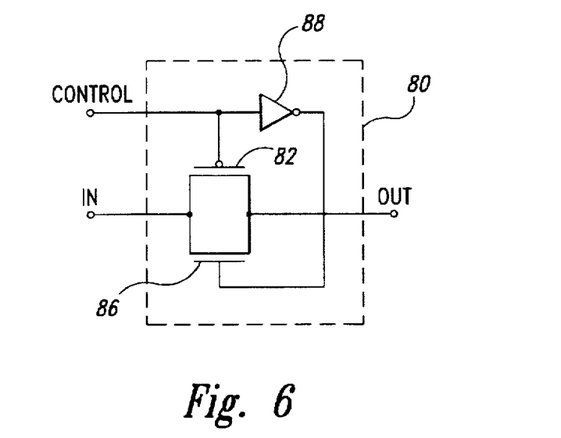
FIG. 6 is a schematic and logic diagram of one embodiment of a pass gate used in the switch circuit embodiment of FIG. 5.

The pass gates 64-68 may be implemented by the pass gate 80 shown in FIG. 6. The pass gate 80 includes a PMOS transistor 82 and an NMOS transistor 86 connected gate-to-gate and source-to-source. The gate of the PMOS transistor 82 and the input of an inverter 88 are connected to a CONTROL input, while the gate of the NMOS transistor 86 is connected to the output of the inverter 88. The sources of the transistors 82, 86 constitute the input of the pass gate 80 while the drains of the transistors 82, 86 constitute the output of the pass gate 80.

In operation, the pass gate 80 is disabled to isolate its output from its input when the CONTROL input is logic high. A logic high is then applied to the gate of the PMOS transistor 82 and a logic low is applied to the gate of the NMOS transistor 86 to maintain the transistors 82, 86 in a non-conductive state. A logic low applied to the gate of the PMOS transistor 82 couples a logic high from the input to the output what a logic high applied to the gate of the NMOS transistor 86 by the inverter 88 at this time couples a logic low from the input to the output.

Figure 7:
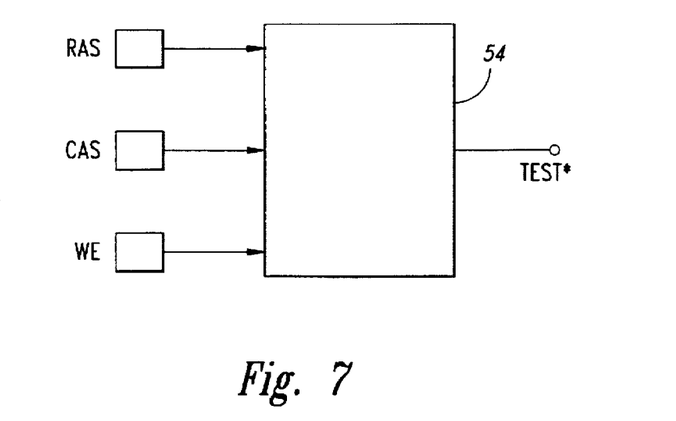
FIG. 7 is block diagram of one embodiment of the switch controller used in the preferred embodiment of FIG. 4.
Figure 8:
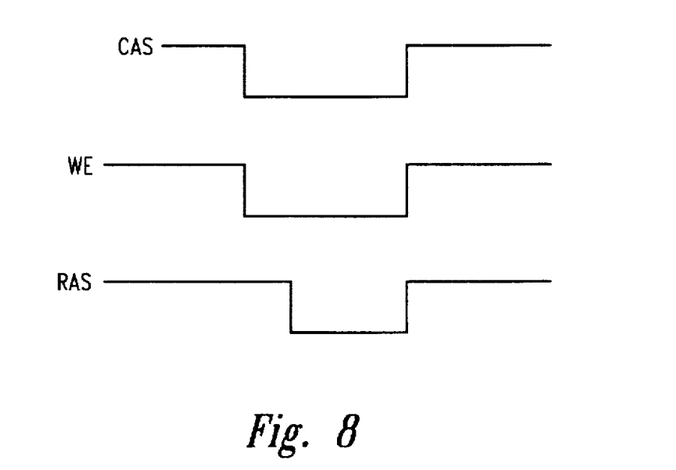
FIG. 8 is a timing diagram showing input signals applied to the switch controller of FIG. 7.

Returning, now, to FIG. 5, it will be recalled that the signal applied to the pass gates 64-68 is generated by the switch controller 54. One embodiment of a switch controller 54 is illustrated in FIG. 7. The switch controller 54 is adapted for use with a DRAM as the functional circuit 40, and it operates to detect a sequence of DRAM control signals that does not normally occur when accessing the DRAM. Specifically, the switch controller 54 receives the row address strobe ("RAS"), the column address strobe ("CAS"), and the write enable ("WE") signals conventionally generated by a DRAM controller (not shown). The switch controller 54 toggles the TEST* signal at its output whenever it detects a high-to-low transition of CAS before a high-to-low transition of RAS whenever WE is logic low, as illustrated in FIG. 7. Thus, on the first occurrence of a high-to-low transition of CAS before RAS with WE low, the TEST* signal goes low to disable the first set of pass gates 64 and enable the second and third sets of pass gates 66, 68. The bonding pads 50 are then connected to the test circuits 44 to allow tests to be conducted to determine the quality of the manufacturing process. For example, the bonding pad 50a can be biased high and its logic level monitored while a low to high transition is applied to the bonding pad 50b to switch on the transistor 60. In this manner, the switching time of the transistor 60 can be determined. Other operating parameters of the transistor 60 (and, inferentially, the operating parameters of circuitry in the functional circuit 40) can also be determined in this manner. When the tests have been completed, a high-to-low transition of CAS before RAS is generated with WE low, thereby causing the TEST* signal to go high to enable the first set of pass gates 64 and disable the second and third sets of pass gates 66, 68. The functional circuit 40 is then once again connected to the bonding pads 50. The circuit details of the switch controller 54 are not shown in FIG. 7 for purposes of brevity since such circuits for detecting the same or similar sequence of DRAM control signals are conventionally used for other purposes.

Figure 9:
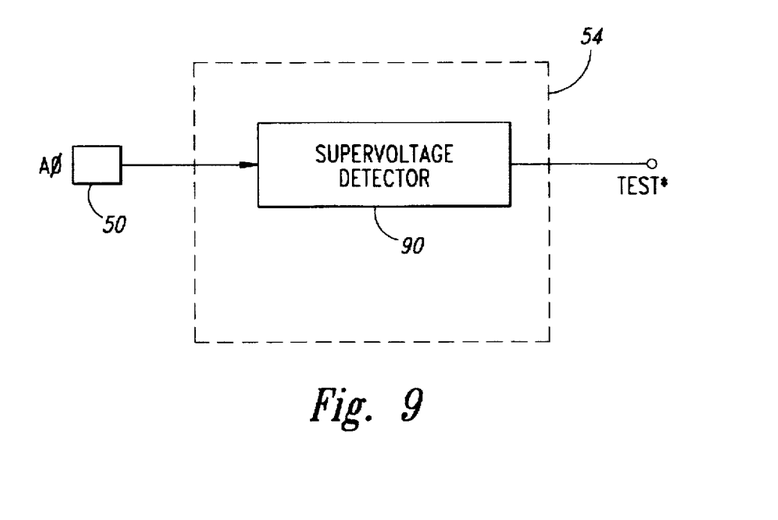
FIG. 9 is a block diagram of another embodiment of the switch controller used in the preferred embodiment of FIG. 4.

An alternative embodiment of a switch controller 54 suitable for use in the embodiment of FIG. 5 is illustrated in FIG. 9. The switch controller of FIG. 9 uses a conventional supervoltage detector 90 connected to an externally accessible mounting pad 50 of the integrated circuit. In the example of FIG. 9, the input to the supervoltage detector 90 is connected to the low order address bit A0, assuming that the functional circuit 40 is a DRAM. As is well known in the art, the supervoltage detector 90 ignores logic levels in the range used by the functional circuit 40. However, upon receipt of a voltage significantly more negative or positive than the range of logic levels used by the functional circuit 40, the supervoltage detector 90 outputs a signal. As used in the switching controller 54 of FIG. 9, the signal output by the supervoltage detector 90 is a logic low TEST* signal.

With reference also to FIG. 5, the supervoltage detector outputs a logic low TEST* signal whenever a supervoltage is applied to the bonding pad 50 to which it is connected. The TEST* signal then goes low to disable the first set of pass gates 64 and enable the second and third sets of pass gates 66, 68. Tests are then conducted on the test circuits 44 as explained above. After the tests have been completed, the supervoltage is removed from the bonding pad 50, thereby causing the TEST* signal to go high to once again enable the first set of pass gates 64 and disable the second and third sets of pass gates 66, 68. The functional circuit 40 is then once again connected to the bonding pads 50.

Although only two embodiments of a switch controller 54 are illustrated in FIGS. 7 and 9, it will be understood that other circuits for selectively generating the TEST* signal may also be used, as will be apparent to one skilled in the art. For example, an externally accessible bonding pad 50 may be used to input the TEST* signal to the switch circuit 48.

Figure 10:
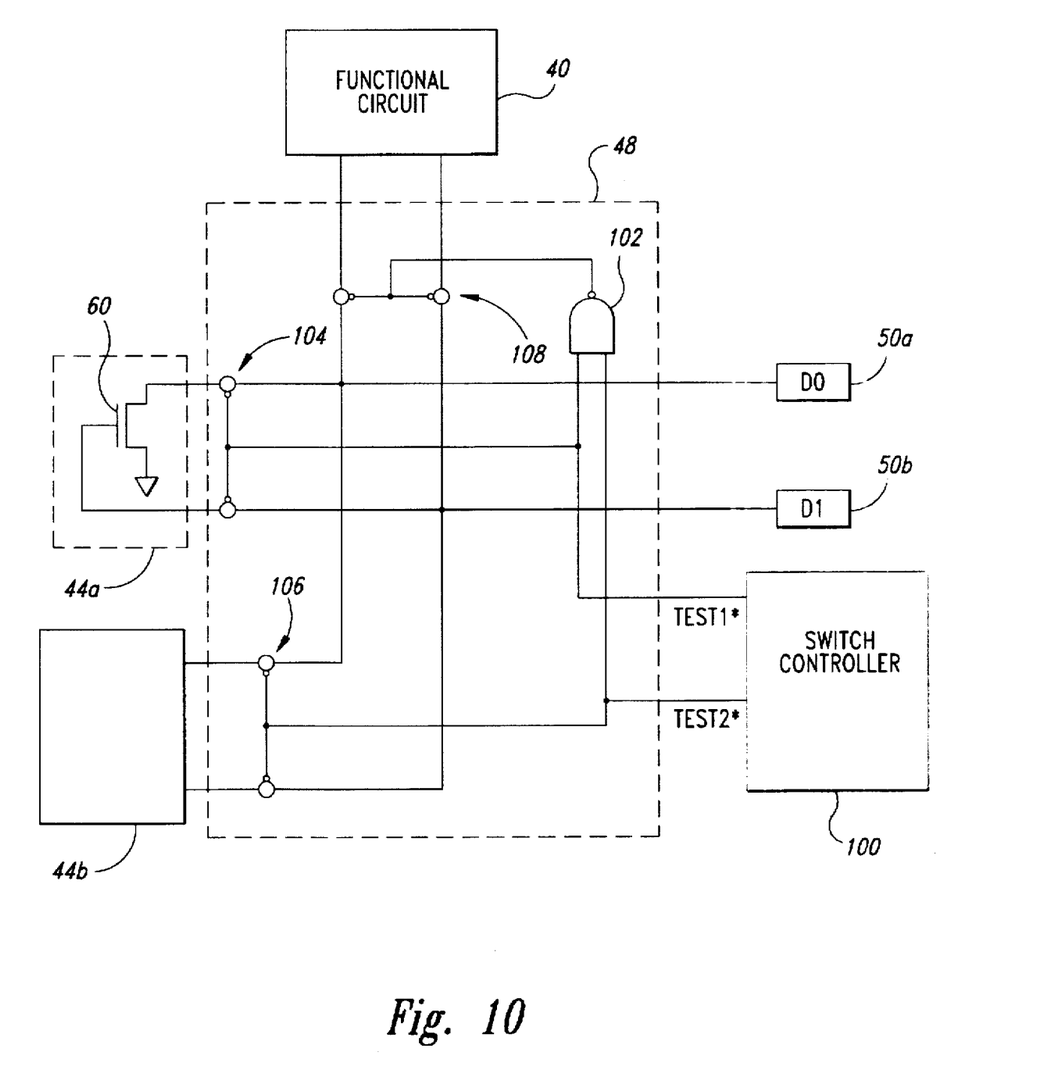
FIG. 10 is a logic and block diagram of another embodiment of the switch controller used in the preferred embodiment of FIG. 4.

Another embodiment of the switch circuit 48 used in the embodiment of FIG. 4 is shown in FIG. 10. The switch circuit 48 of FIG. 10 differs from the embodiment of FIG. 5 in that it alternately connects two rather than four bonding pads 50a,b to either two rather than four respective lines of the functional circuit 40 or to four lines of two test circuits 44a,b. With reference to FIG. 10, the switch circuit 48 is controlled by a switching controller 100 selectively generating two active low TEST1* and TEST2* signals. The TEST1* signal is applied to one input of a NAND gate 102 and to a pair of pass gates 104 connecting the test circuit 44a to the bonding pads 50a,b. The TEST2* signal is applied to the other input of the NAND gate 102 and to a pair of pass gates 106 connecting the test circuit 44b to the bonding pads 50a,b. The output of the NAND gate 102 is connected to a pair of pass gates 108 connecting the functional circuit 40 to the bonding pads 50a,b.

In operation, a logic low TEST1* signal enables the pass gates 104 thereby connecting the test circuit 44a to the bonding pads 50. The logic low TEST1* signal also causes the NAND gate 102 to output a logic high, thereby disabling the pass gates 108. In this condition, the bonding pads 50a,b are connected to the test circuit 44a and isolated from both the functional circuit 40 and the test circuit 44b. Tests may then be conducted on the test circuit 44a to determine the parameters of the test circuit 44a and, by inference, the parameters of the functional circuit 40. Similarly, a logic low TEST2* signal enables the pass gates 106 thereby connecting the test circuit 44b to the bonding pads 50. The logic low TEST2* signal also causes the NAND gate 102 to output a logic high, thereby disabling the pass gates 108. In this condition, the bonding pads 50a,b are connected to the test circuit 44b and isolated from both the functional circuit 40 and the test circuit 44a. Tests may then be conducted on the test circuit 44b. When both the TEST1* signal and the TEST2* signal are inactive high, the pass gates 104, 106 are disabled, and the NAND gate 102 outputs a logic low to enable the functional circuit 40. In this condition, the bonding pads 50a,b are connected to the functional circuit 40 and isolated from both of the test circuits 44a,b. The functional circuit 40 may then operate in the normal operation of the integrated circuit. As with the embodiment of FIG. 5, alternative embodiments of the switch circuit 48 shown in FIG. 10 will be apparent. For example, the TEST1* and TEST2* signals may control the operation of a conventional multiplexer (not shown) having three sets of two inputs.

Figure 11:
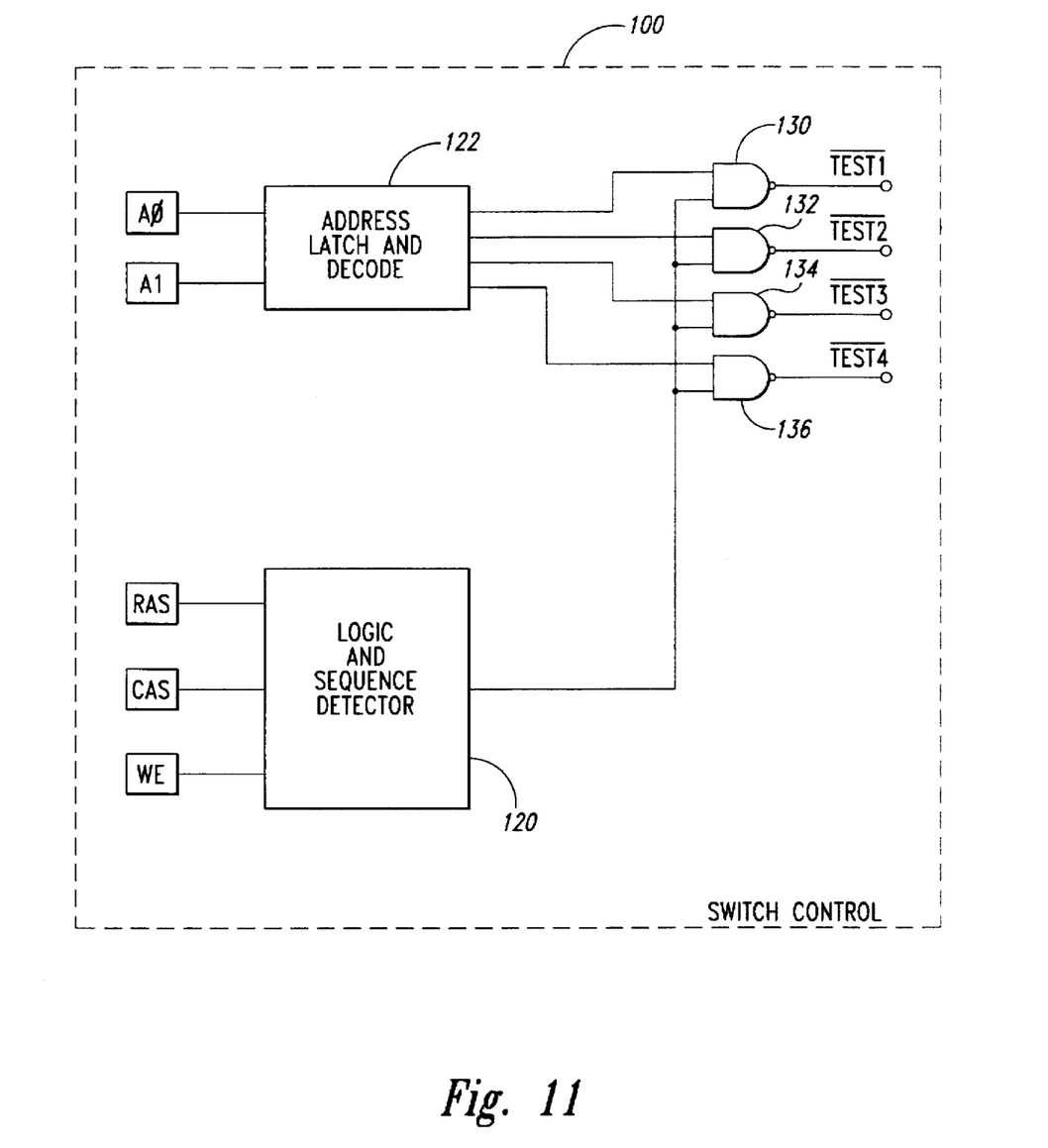
FIG. 11 is a logic and block diagram of one embodiment of the switch controller that may be used in the alternative embodiment of FIG. 10.

One embodiment of a switch controller 100 suitable for use with the switch circuit 48 of FIG. 10 is illustrated in FIG. 11. The switch controller 100 uses a logic and sequence decoder 120 that operates in the same manner as the switch controller 54 of FIG. 7. Also included in the switch controller 100 is a conventional address decoder 122 and four NAND gates 130–136 generating respective TEST1*–TEST4* signals. In operation, a test mode is active whenever the detector 120 detects a high-to-low transition of CAS before a high-to-low transition of RAS when WE is logic low, as illustrated in FIG. 7. Thus, on the first occurrence of a high-to-low transition of CAS before RAS with WE low, the NAND gates 130–136 are enabled. Two bits of an address are then decoded by the address decoder 122 to output a logic high on one of its outputs corresponding to the address. The other outputs of the address decoder 122 remain at logic low. The enabled NAND gate 130–136 that receives the logic high then outputs a logic low TEST* signal. Thus, for example, an address of "10" (binary two) would cause the decoder 122 to apply a high to the NAND gate 132 thereby causing the TEST2* signal to go low. Only the first two outputs (TEST1* and TEST2*) would be used to control the switch circuit 48 of FIG. 10, but the additional outputs could be used to control pass gates connecting the bonding pads 50 to third and fourth test circuits (not shown).

FIG. 11 illustrates only one example of a switch controller 100, and other circuits may be used. For example, the supervoltage detector 90 of FIG. 9 may be used instead of the logic and sequence detector 120. Also, the TEST* signals may be generated by means other than decoding an address, as will be apparent to one skilled in the art.

Figure 12:
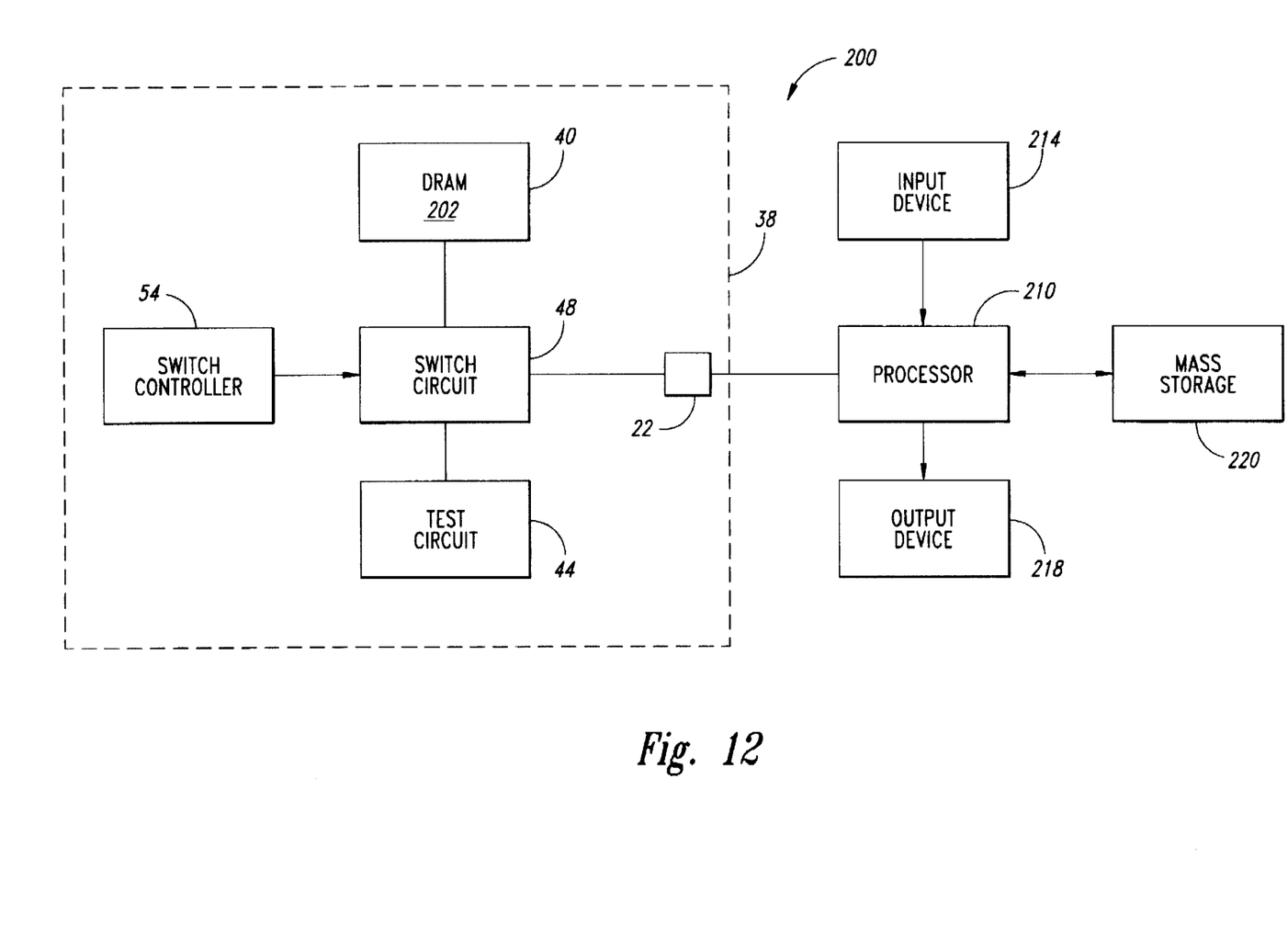
FIG. 12 is a block diagram of one embodiment of the invention used in a computer system.

FIG. 12 is a block diagram of a computer system 200 that uses the preferred embodiment of FIG. 4 in which the functional circuit 40 in the integrated circuit 38 is a DRAM 202. The computer system 200 includes a processor 210 for performing computer functions, such as executing software to perform desired calculations and tasks. The processor 210 is connected through the external contacts 32 (FIG. 3) to respective bonding pads 22, represented in FIG. 12 by a single bonding pad 22. One or more input devices 214, such as a keypad or a mouse, are coupled to the processor 210 and allow an operator (not shown) to manually input data thereto. One or more output devices 218 are coupled to the processor 210 to provide to the operator data generated by the processor 210. Examples of output devices 218 include a printer and a video display unit. One or more mass data storage devices 220 are preferably coupled to the processor 210 to store data in or retrieve data from the storage device 220. Examples of the storage devices 220 include disk drives and compact disk read only memories (CD-ROMs).

It will be appreciated that, although specific embodiments of the invention have been described herein for purposes of illustration, various modifications may be made without departing from the spirit and scope of the invention. Accordingly, the invention is not limited except as by the appended claims.

We claim:

1. An integrated circuit fabricated on a semiconductor die mounted in a semiconductor package, said integrated circuit comprising:

a plurality of pads formed on said semiconductor die;

a plurality of externally accessible electrical contacts in said semiconductor package;

a plurality of conductors connecting a first set of said pads to respective externally accessible electrical contacts;

a functional circuit formed on said semiconductor die, said functional circuit having a plurality of input/output terminals adapted to input or output electrical signals depending upon the function of said functional circuit, the input/output terminals of said functional circuit being coupled to respective pads in said first set;

at least one test circuit formed on said semiconductor die, said test circuit having at least one input/output terminal adapted to input or output an electrical signal;

a switch circuit selectively coupling the input/output terminal of said test circuit to a pad in said first set responsive to a test initiate signal; and a switch controller coupled to said switch circuit, said switch controller being adapted to selectively generate said test initiate signal to cause said switch circuit to couple the input/output terminal of said test circuit to said externally accessible electrical contact.

2. The integrated circuit of claim 1 wherein said first set of pads consists of less than all of the pads formed on said semiconductor die so that said pads include a second set that are unconnected to an externally accessible electrical contact, and wherein the input/output terminal of said test circuit is coupled to a pad in said second set so that said test circuit can be tested before packaging by accessing said test circuit through a pad in said second set.

3. The integrated circuit of claim 1 wherein said test circuit comprises at least one input terminal adapted to receive an input signal, and at least one output terminal on which an output signal is generated in response to said input signal, and wherein said switch circuit selectively couples the input terminal of said test circuit to a respective pad in said first set and the output terminal of said test circuit to a respective pad in said first set responsive to said test initiate signal.

4. The integrated circuit of claim 1 wherein said switch circuit selectively isolates the input/output terminals of said functional circuit from respective pads in said first set responsive to said test initiate signal so that the input/output terminals of said functional circuit are isolated from the pads in said first set when each input/output terminal of said test circuit is coupled to a pad in said first set.

5. The integrated circuit of claim 1 wherein said switch circuit comprises:

a first set of pass gates each having a control terminal, a respective pass gate in said first set being connected between each input/output terminal of said functional circuit and respective pads of said first set, each of said pass gates being conductive responsive to receiving at its control terminal a first logic level and being non-conductive responsive to receiving at its control terminal a second logic level;

a second set of pass gates each having a control terminal, a respective pass gate in said second set being connected between each input/output terminal of said test circuit and respective pads of said first set, each of said pass gates being conductive responsive to receiving at its control terminal said first logic level and being non-conductive responsive to receiving its control terminal said second logic level; and an inverter having an input coupled to said switch controller to receive said test initiate signal, said inverter having an output coupled to the control terminals of the pass gates in one of said first and second sets, the control terminals of the pass gates in other of said first and second sets being coupled to said switch controller to receive said initiate test initiate signal, said inverter generating an output having said second logic level responsive to receipt of a test initiate signal having said first logic level and generating an output having said first logic level responsive to receipt of a test initiate signal having said second logic level so that said first and second sets of pass gates are adapted to be alternately conductive.

6. The integrated circuit of claim 1 wherein said integrated circuit includes a plurality of test circuits each of which has an input and an output terminal, and wherein said switch circuit selectively couples the input and output terminals of each of said test circuits to a respective pad in said first set responsive to said test initiate signal.

7. The integrated circuit of claim 1 wherein said integrated circuit includes a plurality of test circuits each of which has an input and an output terminal, wherein said switch controller generates a respective test initiate signal corresponding to each of said test circuits, and wherein said switch circuit selectively couples the input terminals of said test circuits to a first pad in said first set and the output terminals of said test circuits to a second pad in said first set responsive to receipt of a respective test initiate signal from said switch controller.

8. The integrated circuit of claim 7 wherein said switch circuit selectively couples the input/output terminal of said functional circuit to respective pads in said first set responsive to the absence of any test initiate signal from said switch controller.

9. The integrated circuit of claim 8 wherein said switch circuit comprises:

a set of functional circuit pass gates each having a control terminal, a respective functional circuit pass gate being connected between each input/output terminal of said functional circuit and a respective pad of said first set, each of said functional circuit pass gates being conductive responsive to receiving a first logic level at its control terminal and being non-conductive responsive to receiving a second logic level at its control terminal;

a set of test circuit pass gates corresponding to each of said test circuits, each of said test circuit pass gates having a control terminal connected to said switch controller to receive its respective test initiate signal, a respective test circuit pass gate in each set coupling the input terminal of its respective test circuit to the first pad of said first set and the output terminal of its respective test circuit to the second pad of said first set, each of said test circuit pass gates being conductive responsive to receiving a first logic level at its control terminal and being non-conductive responsive to receiving a second logic level at its control terminal; and a logic gate having an input coupled to said switch controller to receive each of said test initiate signals, said logic gate having an output coupled to the control terminals of said functional circuit pass gates, said logic circuit generating a signal having said first logic level responsive to all of said test initiate signals having said second logic level.

10. The integrated circuit of claim 1 wherein said switch controller comprises a detector having a plurality of inputs coupled to respective pads in a subset of said first set of pads, said detector having an output on which said test initiate signal is generated responsive to detecting a predetermined sequence of signals applied to the pads in the subset of said first set.

11. The integrated circuit of claim 1 wherein said functional circuit responds to logic levels within a predetermined a range of operating voltages, and wherein said switch controller comprises a supervoltage detector having an input coupled to a pad in said first set, said supervoltage detector having an output on which said test initiate signal is generated responsive to detecting a voltage outside of said range of operating voltages applied through said pad to the input of said supervoltage detector.

12. The integrated circuit of claim 1 wherein said integrated circuit includes a plurality of test circuits each of which has an input and an output terminal, wherein said switch circuit selectively couples the input terminals of said test circuits to a first pad in said first set and the output terminals of said test circuits to a second pad in said first set responsive to receipt of a respective test initiate signal, and wherein said switch controller comprises;

a detector selectively generating a test enable signal when a test is to be performed on one of said test circuits;

a decoder having a plurality of inputs coupled to respective pads in a subset of said first set of pads, said decoder having an output corresponding to each of said test circuits on which a respective test circuit select signal is generated corresponding to a respective pattern of signals applied to the inputs of said decoder; and a logic circuit generating one of said test initiate signals when said decoder generates said test enable signal, a test initiate signal being generated corresponding the test circuit select signal generated by said decoder.

13. The integrated circuit of claim 12 wherein said detector comprises a circuit having a plurality of inputs coupled to respective pads in a subset of said first set of pads, said circuit having an output on which said test enable signal is generated responsive to detecting a predetermined sequence of signals applied to the pads in the subset of said first set.

14. The integrated circuit of claim 12 wherein said functional circuit responds to logic levels within a predetermined a range of operating voltages, and wherein said detector comprises a supervoltage detector having an input coupled to a pad in said first set, said supervoltage detector having an output on which said test enable signal is generated responsive to detecting a voltage outside of said range of operating voltages applied through said pad to the input of said supervoltage detector.

15. The integrated circuit of claim 1 wherein said functional circuit comprises a dynamic random access memory.

16. A computer system, comprising:

a processor;

an input device coupled to said processor;

an output device coupled to said processor; and an integrated circuit fabricated on a semiconductor die mounted in a semiconductor package, said semiconductor package being coupled to said processor through a plurality of a plurality of externally accessible electrical contacts mounted in said semiconductor package, said integrated circuit comprising:

a plurality of pads formed on said semiconductor die, the pads in a first set of said pads being coupled to respective externally accessible electrical contacts;

a memory circuit formed on said semiconductor die, said memory circuit having a plurality of input/output terminals adapted to input addressing signals and input or output data and control signals, the input/output terminals of said memory circuit being coupled to respective pads in said first set;

at least one test circuit formed on said semiconductor die, said test circuit having at least one input/output terminal adapted to input or output an electrical signal;

a switch circuit selectively coupling the input/output terminal of said test circuit to a pad in said first set responsive to a test initiate signal; and a switch controller coupled to said switch circuit, said switch controller being adapted to selectively generate said test initiate signal to cause said switch circuit to couple the input/output terminal of said test circuit to said externally accessible electrical contact so that a characteristic of an electrical signal from said test circuit can be determined.

17. The computer system of claim 16 wherein said memory circuit comprises a dynamic random access memory.

18. The computer system of claim 16 wherein said first set of pads consists of less than all of the pads formed on said semiconductor die so that said pads include a second set that are unconnected to an externally accessible electrical contact, and wherein the input/output terminal of said test circuit is coupled to a pad in said second set so that said test circuit can be tested before packaging by accessing said test circuit through a pad in said second set.

19. The computer system of claim 16 wherein said test circuit comprises at least one input terminal adapted to receive an input signal, and at least one output terminal one which an output signal is generated in response to said input signal, and wherein said switch circuit selectively couples the input terminal of said test circuit to a respective pad in said first set and the output terminal of said test circuit to a respective pad in said first set responsive to said test initiate signal.

20. The computer system of claim 16 wherein said switch circuit selectively isolate the input/output terminals of said memory circuit from respective pads in said first set responsive to said test initiate signal so that the input/output terminals of said memory circuit are isolated from the pads in said first set when each input/output terminal of said test circuit is coupled to a pad in said first set.

21. The computer system of claim 16 wherein said switch circuit comprises:

a first set of pass gates each having a control terminal, a respective pass gate in said first set being connected between each input/output terminal of said memory circuit and respective pads of said first set, each of said pass gates being conductive responsive to receiving at its control terminal a first logic level and being non-conductive responsive to receiving at its control terminal a second logic level;

a second set of pass gates each having a control terminal, a respective pass gate in said second set being connected between each input/output terminal of said test circuit and respective pads of said first set, each of said pass gates being conductive responsive to receiving at its control terminal said first logic level and being non-conductive responsive to receiving its control terminal said second logic level; and an inverter having an input coupled to said switch controller to receive said test initiate signal, said inverter having an output coupled to the control terminals of the pass gates in one of said first and second sets, the control terminals of the pass gates in other of said first and second sets being coupled to said switch controller to receive said initiate test signal, said inverter generating an output having said second logic level responsive to receipt of a test initiate signal having said first logic level and generating an output having said first logic level responsive to receipt of a test initiate signal having said second logic level so that said first and second sets of pass gates are adapted to be alternately conductive.

22. The computer system of claim 16 wherein said integrated circuit includes a plurality of test circuits each of which has an input and an output terminal, and wherein said switch circuit selectively couples the input and output terminals of each of said test circuits to a respective pad in said first set responsive to said test initiate signal.

23. The computer system of claim 16 wherein said integrated circuit includes a plurality of test circuits each of which has an input and an output terminal, wherein said switch controller generates a respective test initiate signal corresponding to each of said test circuits, and wherein said switch circuit selectively couples the input terminals of said test circuits to a first pad in said first set and the output terminals of said test circuits to a second pad in said first set responsive to receipt of a respective test initiate signal from said switch controller.

24. The computer system of claim 23 wherein said switch circuit selectively couples the input/output terminal of said memory circuit to respective pads in said first set responsive to the absence of any test initiate signals from said switch controller.

25. The computer system of claim 24 wherein said switch circuit comprises:

a set of memory circuit pass gates each having a control terminal, a respective memory circuit pass gate being connected between each input/output terminal of said memory circuit and a respective pad of said first set, each of said memory circuit pass gates being conductive responsive to receiving a first logic level at its control terminal and being non-conductive responsive to receiving a second logic level at its control terminal;

a set of test circuit pass gates corresponding to each of said test circuits, each of said test circuit pass gates having a control terminal connected to said switch controller to receive its respective test initiate signal, a respective test circuit pass gate in each set coupling the input terminal of its respective test circuit to the first pad of said first set and the output terminal of its respective test circuit to the second pad of said first set, each of said test circuit pass gates being conductive responsive to receiving a first logic level at its control terminal and being non-conductive responsive to receiving a second logic level at its control terminal; and a logic gate having an input coupled to said switch controller to receive each of said test initiate signals, said logic gate having an output coupled to the control terminals of said functional circuit pass gates, said logic circuit generating a signal having said first logic level responsive to all of said test initiate signals having said second logic level.

26. The computer system of claim 16 wherein said switch controller comprises a detector having a plurality of inputs coupled to respective pads in a subset of said first set of pads, said detector having an output on which said test initiate signal is generated responsive to detecting a predetermined sequence of signals applied to the pads in the subset of said first set.

27. The computer system of claim 16 wherein said memory circuit responds to logic levels within a predetermined a range of operating voltages, and wherein said switch controller comprises a supervoltage detector having an input coupled to a pad in said first set, said supervoltage detector having an output on which said test initiate signal is generated responsive to detecting a voltage outside of said range of operating voltages applied through said pad to the input of said supervoltage detector.

28. The computer system of claim 16 wherein said integrated circuit includes a plurality of test circuits each of which has an input and an output terminal, wherein said switch circuit selectively couples the input terminals of said test circuits to a first pad in said first set and the output terminals of said test circuits to a second pad in said first set responsive to receipt of a respective test initiate signal, and wherein said switch controller comprises;

a detector selectively generating a test enable signal when a test is to be performed on one of said test circuits;

a decoder having a plurality of inputs coupled to respective pads in a subset of said first set of pads, said decoder having an output corresponding to each of said test circuits on which a respective test circuit select signal is generated corresponding to a respective pattern of signals applied to the inputs of said decoder; and a logic circuit generating one of said test initiate signals when said decoder generates said test enable signal, the test initiate signal corresponding the test circuit select signal generated by said decoder.

29. The computer system of claim 28 wherein said detector comprises a circuit having a plurality of inputs coupled to respective pads in a subset of said first set of pads, said circuit having an output on which said test enable signal is generated responsive to detecting a predetermined sequence of signals applied to the pads in the subset of said first set.

30. The integrated circuit of claim 28 wherein said memory circuit responds to logic levels within a predetermined a range of operating voltages, and wherein said detector comprises a supervoltage detector having an input coupled to a pad in said first set, said supervoltage detector having an output on which said test enable signal is generated responsive to detecting a voltage outside of said range of operating voltages applied through said pad to the input of said supervoltage detector.

31. A method of testing an integrated circuit fabricated on a semiconductor die mounted in a semiconductor package having a plurality of externally accessible electrical contacts, said integrated circuit die having formed thereon a functional circuit having a plurality of input/output terminals adapted to input or output electrical signals depending upon the function of said functional circuit, at least one test circuit having at least one input/output terminal adapted to input or output an electrical signal, and a plurality of bonding pads with a first set of said bonding pads being coupled to respective input/output terminals of said functional circuit, said integrated circuit further including a conductor connecting at least some of the bonding pads in said first set to respective externally accessible electrical contacts, said method comprising selectively coupling the input/output terminal of said test circuit to one of the pads in said first set, and performing a test on said test circuit through the input/output terminal of said test circuit to obtain an electrical signal from said integrated circuit, and determining a characteristic of said electrical signal.

32. The method of claim 31 wherein said test circuit comprises at least one input terminal adapted to receive an input signal, and at least one output terminal one which said electrical signal is generated in response to said input signal, and wherein said method further comprises selectively coupling the input terminal of said test circuit to a respective pad in said first set and coupling the output terminal of said test circuit to a respective pad in said first set.

33. The method of claim 31 further comprising isolating the input/output terminals of said functional circuit from the pads in said first set when each input/output terminal of said test circuit is connected to a pad in said first set, and coupling the input/output terminals of said functional circuit to respective pads in said first set when each input/output terminal of said test circuit is isolated from a pad in said first set.

34. The method of claim 31 wherein said integrated circuit includes a plurality of test circuits each of which has an input/output terminal adapted to input or output an electrical signal, and wherein said method further comprises selectively coupling an input/output terminal of each of said test circuits to a first pad in said first set.

35. The method of claim 34 wherein said step of selectively coupling an input/output terminal of each of said test circuits to a first pad in said first set comprises selecting one of said test circuits by detecting respective patterns of signals applied to a subset of the pads in said first set of pads, and selectively coupling an input/output terminal of the selected test circuit to a first pad in said first set.

36. The method of claim 34 wherein said step of selectively coupling an input/output terminal of the selected test circuit to a first pad in said first set further comprises detecting a predetermined sequence of signals applied to the pads in the subset of said first set, and coupling the input/output terminal of said test circuit to the selected test circuit when said predetermined sequence of signals is detected.

37. The method of claim 34 wherein said functional circuit responds to logic levels within a predetermined a range of operating voltages, and wherein said step of selectively coupling an input/output terminal of the selected test circuit to a first pad in said first set further comprises detecting a voltage outside of said range of operating voltages applied through a pad in said first set, and coupling the input/output terminal of said test circuit to the selected test circuit when a voltage outside of said range of operating voltages is detected.

38. The method of claim 31 wherein said step of selectively coupling the input/output terminal of said test circuit to one of the pads in said first set comprises detecting a predetermined sequence of signals applied to the pads in the subset of said first set, and coupling the input/output terminal of said test circuit to one of the pads in said first set when said predetermined sequence of signals is detected.

39. The method of claim 31 wherein said functional circuit responds to logic levels within a predetermined a range of operating voltages, and wherein said step of selectively coupling the input/output terminal of said test circuit to one of the pads in said first set comprises detecting a voltage outside of said range of operating voltages applied through a pad in said first set, and coupling the input/output terminal of said test circuit to one of the pads in said first set when said voltage outside of said range of operating voltages is detected.

* * * * *